Oct. 11, 1960 R. S. McCREADIE 2,955,351

METHOD OF MAKING A PRINTED CIRCUIT

Filed Dec. 28, 1954

INVENTOR.
Robert S. McCreadie
BY

ATTORNEY.

United States Patent Office 2,955,351
Patented Oct. 11, 1960

2,955,351

METHOD OF MAKING A PRINTED CIRCUIT

Robert S. McCreadie, Glen Arbor, Mich., assignor to Plast-O-Fab Circuits, Inc., Syracuse, N.Y., a corporation of New York Filed Dec. 28, 1954, Ser. No. 478,039
7 Claims. (Cl. 29—155.5)

Figures 1, 2, 3, 4, 5, 6, 7:
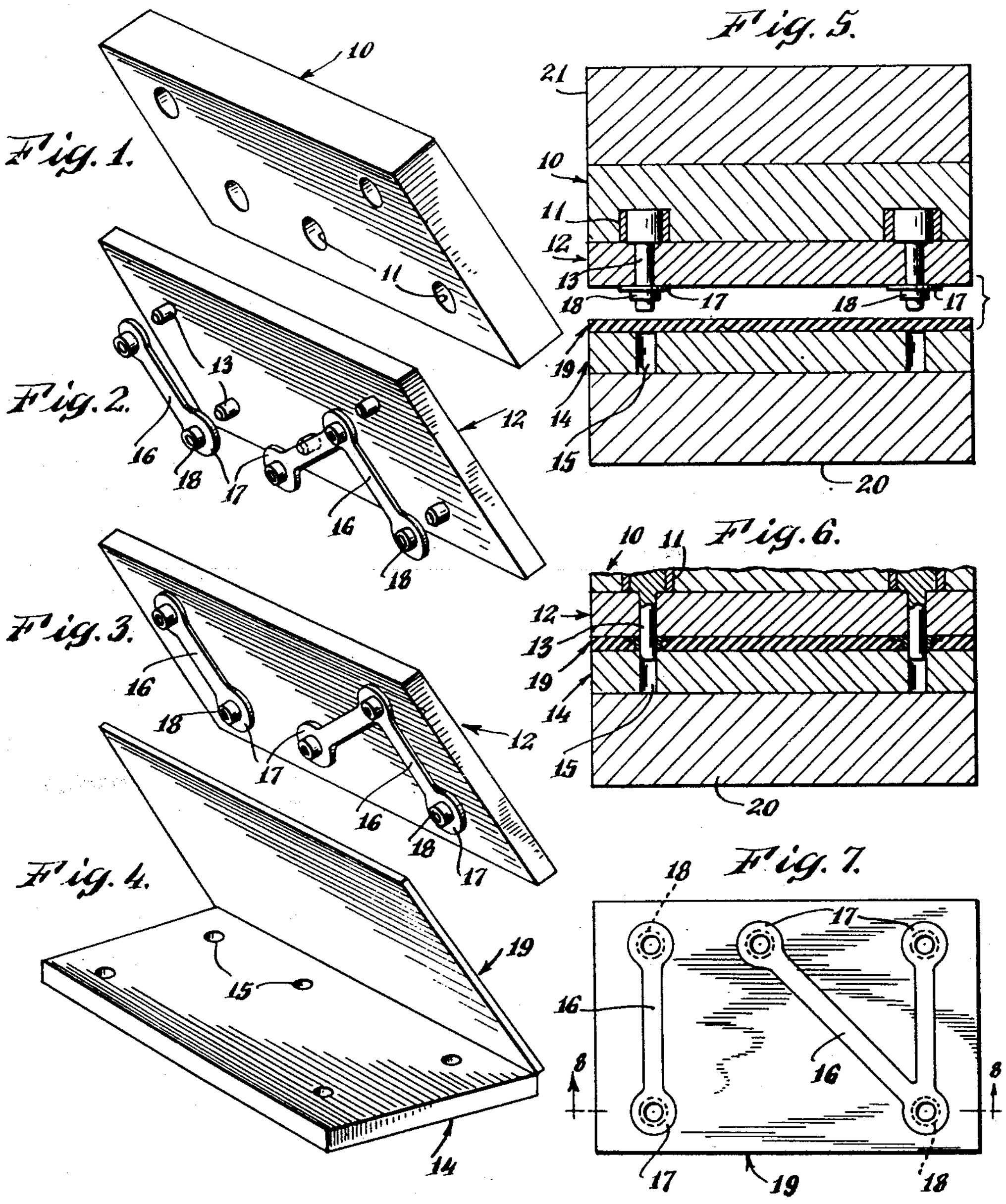

This invention relates to electronics and more particularly to a printed circuit for electronic apparatus and a method of producing the same.

Printed circuits for electronic apparatus are relatively well known and considerable development work has been done in connection therewith. Heretofore, such circuits have been produced in a variety of ways among which is the deposition of metallic strips on an insulating sheet by means of electro-plating, spraying, printing and various other known methods of depositing metal and also these circuits have been produced by applying pre-formed strips of metal to an insulating base sheet with such metal strips attached thereto by an adhesive or other bonding material.

While these prior printed circuits have proven relatively satisfactory, nevertheless, some difficulty has been experienced in preventing inadvertent separation of the metal conducting strips from the insulating base sheet and furthermore, considerable difficulty has been experienced in providing suitable terminals for connecting various portions of the circuit and for attaching components thereto.

Since in order to be economically feasible printed circuits must be produced at a relatively rapid rate and at a relatively low cost it is obvious that any process which will result in increasing the speed of production and in providing a firm bond between circuit elements and the insulating base sheet as well as provide suitable terminal portions represents a very material step forward in the art.

It is accordingly an object of the invention to provide a method of making a printed circuit in which the circuit elements may be applied to an insulating sheet base and firmly bonded thereto, such method permitting relatively rapid production of such printed circuits.

A further object of the invention is the provision of a method of making a printed circuit in which the circuit elements are applied to and embedded in an insulating base sheet and at the same time firmly bonded to such sheet.

A still further object of the invention is the provision of a method of making a printed circuit in which apertures are punched in an insulating base sheet simultaneously with the application of the circuit elements thereto and terminal portions of such circuit elements disposed in such apertures.

Another object of the invention is the provision of a method of making a printed circuit in which the circuit elements may be applied to an insulating base sheet and tubular terminal portions disposed in apertures in such sheet, the entire method being carried out in a conventional laminating press.

A further object of the invention is the provision of a method of making a printed circuit in which the circuit elements are embedded in the surface of an insulating base sheet and tubular terminal portions disposed in apertures in such sheet, the apertures being punched and the circuit elements and terminal portions being embedded and applied to the base sheet in a single pressing operation.

Another object of the invention is the provision of a method of making a printed circuit utilizing male and female die-plates and in which such die-plates may be re-used any desired number of times.

A further object of the invention is the provision of a printed circuit in which conductor elements are embedded in the surface of an insulating base sheet and firmly adhered thereto and terminal elements comprising tubular projections are disposed in apertures in such base sheet.

Figure 8:
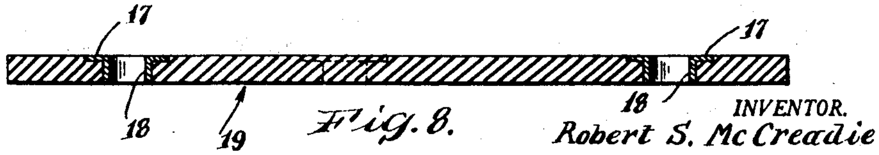

Further objects and advantages of the invention will be apparent from the following description taken in conjunction with the accompanying drawing wherein:

Fig. 1 is a view in perspective showing a press plate utilized in the method of this invention;

Fig. 2, a view in perspective of the male die-plate utilized in the method of this invention and with the circuit elements and terminal elements shown in super-imposed relation thereto;

Fig. 3, a view in perspective showing the male die-plate utilized in the method of this invention with the circuit and terminal elements in place thereon prior to the pressing operation;

Fig. 4, an exploded view in perspective showing the female die-plate and the insulating base sheet to be positioned thereon;

Fig. 5, a longitudinal sectional view showing the male and female die-plates in place in a press prior to the pressing operation;

Fig. 6, a view similar to Fig. 5, and showing the manner in which the male die-plate operates to apply the circuit elements and terminal portions to the insulating base sheet;

Fig. 7, a top plan view of a printed circuit and base sheet produced by the method of this invention; and Fig. 8, a sectional view taken on the line 8—8 of Fig. 7 and showing the completed printed circuit and insulated base sheet produced by the method of this invention.

With continued reference to the drawing there is shown a press plate 10 of suitable thickness and size of the type commonly employed in a conventional laminating press and this press plate 10 is provided in one surface thereof with a plurality of recesses 11, the purpose of which will be presently described.

A male die-plate 12 is provided which is normally of substantially the same configuration and size as the press plate 10 and the die-plate 12 may be provided on one side thereof with a plurality of punches 13 which may be either fixed in the die-plate 12 or slidable therein in a well known manner common in the press art. As many punches 13 as required for the purpose intended may be provided and if such punches are to be slidable in the die-plate 12 there is usually provided a resilient backing means for the punches 13 which permits retraction thereof after passing through the material to be punched.

There is also provided a female die-plate 14 of substantially the same size and configuration as the male die-plate 12 and the female die-plate 14 is provided with a plurality of apertures 15 therein which are located in alignment with the punches 13 in the male die-plate 12 and are complementary thereto.

In carrying out the method of this invention, the male die-plate 12 may be subjected to an etching operation on the surface thereof from which the punches 13 extend, such etching operation serving to remove a relatively small portion of the metal from such surface and in this operation a portion of the surface remains in its original form to provide a pattern corresponding to the electrical circuit desired. This pattern may be in the form of strips extending between certain of the punches 13 and the actual conducting elements of the circuit are formed in accordance with this pattern in a manner to be presently described. The male die-plate 12 is commonly formed of stainless steel and the unetched surface thereof is given a relatively high polish and the etched portion of the surface of the die-plate 12 is coated with a suitable parting agent which will prevent adhesion of the same to a metal surface or to the surface of the insulating base sheet which may, for instance, be formed of a phenolic plastic and to which the printed circuit is to be applied.

After completion of the etching operation and the coating of the etched surface with a parting agent, suitable metal, such as copper is electro-plated onto the unetched portion of the male die-plate 12 to form conductor elements in the nature of strips of metal 16 which are provided with enlarged portions 17 at their ends surrounding the punches 13 and since the metal is also electro-plated over the punches 13 there is provided integral with the strips 16, tubular terminal projections 18 surrounding and supported by the punches 13. The form of the connecting or conductor strips 16, the enlargement 17 and the terminal projections 18, as shown in the drawing are for illustrative purposes only, and obviously, these conductor portions may be inter-connected as desired, and any number of terminal projections may be employed in order to provide a suitable electrical circuit and to permit the inter-connection of circuit elements and the connection of components, such as electronic tubes, resistors and the like thereto.

After completing of the plating operation the male die-plate 12 with the circuit elements and terminal elements thereon is in the condition as shown in Fig. 3, and an insulating base sheet 19 of suitable material, such as a phenolic plastic is provided and normally this base sheet 19 would be of substantially the same size and configuration as the male and female die-plates 12 and 14. However, the base sheet 19 may, of course, be of any other size and configuration which may be necessary for the apparatus in which the printed circuit is to be incorporated. The insulating base sheet 19 may be of a single thickness of material or may be of a plurality of sheets to be laminated and the uppermost sheet may be in the form of a suitable adhesive or may be coated with a suitable adhesive or, if desired, the circuit elements 16, 17 and 18 on the male die-plate 12 may be coated with a suitable adhesive which may be cured in the presence of heat and pressured. Likewise, the plastic forming the base sheet 19 is normally uncured and is cured in the presence of heat and pressure during the application of the circuit elements thereto.

With particular reference to Fig. 5, the female die-plate 14 is positioned on the platen 20 of a suitable press of the type commonly employed for laminating operations and the male die-plate 12 with the circuit elements carried thereby is secured to the press plate 10 which in turn is secured to the ram 21 of the press. It will be noted that the recesses 11 in the press plate 10 are located in alignment with the punches 13 and such punches may if desired, retract into these recesses upon completion of the punching operation.

The insulating base sheet 19 is positioned on the female die-plate 14 and upon movement of the male die-plate 12 toward the insulating base sheet 19, the punches 13 will pierce the sheet 19 to provide apertures therein and at the same time, the terminal projections 18 will enter the apertures provided by the piercing operation and since the pressing operation is carried out in the presence of sufficient heat to effect a cure of the base sheet 19, upon contact of the circuit elements with the surface of such sheet, the same will be embedded therein as clearly shown in Figs. 6 and 8, and likewise, the terminal projections 18 will be disposed in the apertures provided by the punches 13 and extend substantially through the base sheet 19. Pressure is maintained on the male die-plate 12 for a sufficient time to effect a complete cure of the insulating base sheet 19 and also of the adhesive applied thereto and upon withdrawal of the male die-plate 12 away from the sheet 19, the circuit elements and terminal projections will be removed from the male die-plate 12 and will remain in position on the base sheet 19 embedded in the surface thereof and firmly bonded thereto.

Upon completion of the pressing and curing operation, the base sheet 19 with the circuit and terminal elements applied thereto may be removed from the press and utilized in any desired manner. Likewise, the male die-plate 12 may be removed from the press and circuit elements as well as the terminal projections against electro-plated thereon and the operation repeated. Obviously, a relatively large number of male die-plates 12 may be provided in order that the operation may be substantially continuous and as a result the production of a printed circuit in accordance with the method of this invention may be carried out at a relatively rapid rate.

The completed printed circuit, as shown in Figs. 7 and 8, is relatively economical to produce and results in all of the circuit elements being firmly bonded to the base sheet and at the same time, terminal portions extending through apertures in the sheet and firmly held therein are provided which materially facilitates making connections between portions of the circuit and other circuits embedded in other base sheets and also provided a convenient means for attaching various components to the circuit. The diameter of the tubular terminal portions may be such as to receive the prongs of an electronic tube or connecting prongs of other components to be utilized in conjunction with the circuit and this avoids the relatively high resistance connection which has been provided by the heretofore method of providing terminals by utilizing eyelets passing through the base sheet and crimped into engagement with the conducting portions of the circuit elements.

Variations in the method, as described above, are entirely possible and might take the form of producing the circuit elements and terminal projections in a separate operation and subsequently applying the same to the male die-plate 12 and punches 13, but since such circuit elements are relatively thin and fragile, the method described above of plating the same directly on the male die-plate 12 is to be preferred. It is also conceivable that the insulating base sheet 19 may be cured prior to utilization of this process and the circuit elements embedded therein by heat and pressure and bonded thereto by a suitable adhesive which may be either of the pressure sensitive type or may be of the type which requires heat and pressure for the curing thereof.

It will be seen that by the above described invention there has been provided a method of producing a printed circuit in which the circuit elements may be firmly secured to an insulating base sheet and embedded in a surface thereof and, at the same time, suitable terminal portions are provided which extend through apertures in such sheet and provide a firm anchor for the circuit elements as well as a convenient means for connecting components or other circuits thereto. The method is obviously susceptible of extremely rapid production and thereby results in printed circuits produced at a relatively low cost and which may be conveniently incorporated in low cost electronic apparatus.

It will be obvious to those skilled in the art that various changes may be made in the invention without departing from the spirit and scope thereof and therefore the invention is not limited by that which is shown in the drawing and described in the specification, but only as indicated in the appended claims.

What is claimed is:

1. A method of making a printed circuit comprising providing a male die-plate having punches projecting from a surface thereof at desired locations, etching the surface of said plate in desired locations to provide a raised circuit pattern with portions thereof terminating at said punches, coating said etched surface with a parting agent, electro-plating metal on said pattern and said punches to provide a circuit comprising tubular terminal projections connected by conductor strips, providing a female die-plate having apertures complementary to said punches, positioning an insulating base sheet of uncured phenolic plastic having an uncured adhesive coating on said female die-plate, positioning said male die-plate with said circuit thereon over said female die-plate with said punches in alignment with said apertures, applying heat and pressure to said die-plates to force said punches through said base sheet and embed said circuit in the surface of said base sheet with projections disposed in the apertures formed by said punches and cure said sheet and said adhesive and removing said die-plates to provide an insulating base sheet having a circuit embedded and bonded thereto and with terminal portions of said circuit disposed in apertures in said sheet.

2. A method of making a printed circuit comprising providing a male die-plate having punches projecting from a surface thereof at desired locations, etching the surface of said plate at desired locations to provide a raised circuit pattern with portions thereof terminating at said punches, coating said etched surface with a parting agent, electro-plating metal on said pattern and said punches to provide a circuit comprising tubular terminal projections connected by conductor strips, providing a female die-plate having apertures complementary to said punches, positioning an insulating base sheet of uncured plastic having an uncured adhesive coating on said female die-plate, positioning said male die-plate with said circuit thereon over said female die-plate with said punches in alignment with said apertures, applying heat and pressure to said die-plate to force said punches through said base sheet and embed said circuit in the surface of said base sheet with said projections disposed in the apertures formed by said punches and cure said sheet and said adhesive and removing said die-plates to provide an insulating base sheet having a circuit embedded and bonded thereto and with terminal portions of said circuit disposed in apertures in said sheet.

3. A method of making a printed circuit comprising providing a male die-plate having punches projecting from a surface thereof at desired locations, etching the surface of said plate in desired locations to provide a raised circuit pattern with portions thereof terminating in said punches, coating said etched surface with a parting agent, electro-plating metal on said pattern and said punches to provide a circuit comprising tubular terminal projections connected by conductor strips, providing a female die-plate having apertures complementary to said punches, positioning an insulating base sheet of plastic having an adhesive coating on said female die-plate, positioning said male die-plate with said circuit thereon over said female die-plate with said punches in alignment with said apertures, applying heat and pressure to said die-plate to force said punches through said base sheet and embed said circuit in the surface of said base sheet with said projections in the apertures formed by said punches and removing said die-plates to provide an insulating base sheet having a circuit embedded and bonded thereto and with terminal portions of said circuit disposed in apertures in said sheet.

4. A method of making a printed circuit comprising providing a male die-plate having punches projecting from a surface thereof at desired locations, etching the surface of said plate in desired locations to provide a raised circuit pattern with portions thereof terminating at said punches, electro-plating metal on said pattern and said punches to provide a circuit comprising tubular terminal projections connected by conductor strips, providing a female die-plate having apertures complementary to said punches, positioning an insulating base sheet of plastic having an adhesive coating on said female die plate, positioning said male die-plate with said circuit thereon over said female die-plate with said punches in alignment with said apertures, applying heat and pressure to said die-plates to force said punches through said base sheet and embed said circuit in the surface of said base sheet with said projections disposed in the apertures formed by said punches and removing said die-plates to provide an insulating base sheet having a circuit embedded and bonded thereto and with terminal portions of said circuit disposed in apertures in said sheet.

5. A method of making a printed circuit comprising providing a male die-plate having punches projecting from a surface thereof at desired locations, etching the surface of said plate in desired locations to provide a raised circuit pattern with portions thereof terminating at said punches, depositing metal on said pattern and said punches to provide a circuit comprising tubular terminal projections connected by conductor strips, providing a female die-plate having apertures complementary to said punches, positioning an insulating base sheet of plastic having an adhesive coating on said female die-plate, positioning said male die-plate with said circuit thereon over said female die-plate with said punches in alignment with said apertures, applying heat and pressure to said die-plates to force said punches through said base sheet and embed said circuit in the surface of said base sheet with said projections disposed in the apertures formed by said punches and removing said die-plates to provide an insulating base sheet having a circuit embedded and bonded thereto and with terminal portions of said circuit disposed in apertures in said sheet.

6. A method of making a printed circuit comprising providing a male die-plate having punches projecting from a surface thereof at desired locations, etching the surface of said plate in desired locations to provide a raised circuit pattern with portions thereof terminating at punches, depositing metal on said pattern and said punches to provide a circuit comprising tubular terminal projections connected by conductor strips, providing a female die-plate having apertures complementary to said punches, positioning an insulating base sheet of plastic having an adhesive coating on said female die-plate, positioning said male die-plate with said circuit thereon over said female die-plate with said punches in alignment with said apertures, applying pressure to said die-plates to force said punches through said base sheet and embed said circuit in the surface of said base sheet with said projections disposed in the apertures formed by said punches, and removing said die plates to provide an insulating base sheet having a circuit embedded and bonded thereto with terminal portions of said circuit disposed in apertures in said sheet.

7. A method of making a printed circuit comprising providing a male die-plate having punches projecting from a surface thereof at desired locations, etching the surface of said plate in desired locations to provide a raised circuit pattern with portions thereof terminating at said punches, depositing metal on said pattern and said punches to provide a circuit comprising tubular terminal projections connected by conductor strips, providing a female die-plate having apertures complementary to said punches, positioning an insulating base sheet of plastic on said female die-plate, positioning said male die-plate with said circuit thereon over said female die-plate with said punches in alignment with said apertures, applying pressure to said die-plates to force said punches through said base sheet and embed said circuit in the surface of said base sheet with said projections disposed in the apertures formed by said punches and removing said die-plates to provide an insulating base sheet having a circuit embedded and bonded thereto and with terminal portions of said circuit disposed in apertures in said sheet.

(References on following page)

References Cited in the file of this patent

UNITED STATES PATENTS

| | | |
|---|---|---|
| 1,892,146 | Harshberger | Dec. 27, 1932 |
| 2,120,711 | Phillips | June 14, 1938 |
| 2,320,498 | Wheeler | June 1, 1943 |
| 2,433,384 | McLarn | Dec. 30, 1947 |
| 2,447,541 | Sabee et al. | Aug. 24, 1948 |
| 2,603,681 | Salisbury | July 15, 1952 |
| 2,616,823 | Weymouth | Nov. 4, 1952 |
| 2,633,441 | Buttress | Mar. 31, 1953 |
| 2,651,833 | Kernahan | Sept. 15, 1953 |
| 2,734,150 | Beck | Feb. 7, 1956 |
| 2,743,629 | Pellegrino et al. | May 1, 1956 |